US009829710B1

(12) United States Patent
Newell et al.

(10) Patent No.: US 9,829,710 B1
(45) Date of Patent: Nov. 28, 2017

(54) DISPLAY WITH STACKED EMISSION AND CONTROL LOGIC LAYERS

(71) Applicant: Valve Corporation, Bellevue, WA (US)

(72) Inventors: Dan Newell, Medina, WA (US); Jeremy Daniel Popp, Duval, WA (US)

(73) Assignee: Valve Corporation, Bellevue, WA (US)

( * ) Notice: Subject to any disclaimer, the term of this patent is extended or adjusted under 35 U.S.C. 154(b) by 0 days.

(21) Appl. No.: 15/059,171

(22) Filed: Mar. 2, 2016

(51) Int. Cl.
*H01L 23/522* (2006.01)
*G02B 27/01* (2006.01)
*H01L 27/32* (2006.01)
*H01L 51/52* (2006.01)
*G09G 3/3258* (2016.01)
*G09G 3/36* (2006.01)
*G09G 3/32* (2016.01)

(52) U.S. Cl.
CPC ..... *G02B 27/0172* (2013.01); *G02B 27/0176* (2013.01); *G09G 3/32* (2013.01); *G09G 3/3258* (2013.01); *G09G 3/3659* (2013.01); *H01L 23/5226* (2013.01); *H01L 27/322* (2013.01); *H01L 27/3211* (2013.01); *H01L 51/5275* (2013.01); *G02B 2027/0178* (2013.01); *G09G 2300/0408* (2013.01); *G09G 2300/0452* (2013.01); *G09G 2320/0626* (2013.01)

(58) Field of Classification Search
CPC ............ G02B 27/0172; G02B 27/0176; G02B 27/017; G02B 2027/0178; G09G 3/32; G09G 3/3258; G09G 3/3659; G09G 2300/0408; G09G 2300/0452; G09G 2320/0626; H01L 23/5226; H01L 27/3211; H01L 27/322; H01L 51/5275; H01L 23/147; H01L 27/156; G01R 33/10
See application file for complete search history.

(56) References Cited

U.S. PATENT DOCUMENTS

| 5,903,098 | A | * | 5/1999 | Jones | ...................... | G01R 33/10 313/309 |
| 2006/0033992 | A1 | * | 2/2006 | Solomon | .............. | G02B 27/017 359/462 |
| 2015/0108657 | A1 | * | 4/2015 | Kim | ...................... | H01L 23/147 257/774 |

(Continued)

*Primary Examiner* — Richard Hong
(74) *Attorney, Agent, or Firm* — Seed Intellectual Property LLP

(57) ABSTRACT

The disclosure relates generally to a display panel, which in at least some situations includes multiple separate stacked layers or components that are combined together, such as to have one emission layer component with numerous pixels that emit light, and to have at least one control logic layer component that includes integrated circuits or other logic to control the emission of light by the pixels in the emission layer. The different layers may be separate silicon chips or wafers that are connected in a stacked structure via a flip chip technique, with the emission layer using AMOLED or other OLED pixels. The display panels may be designed and/or configured for use in head mounted displays (e.g., with a fully immersive virtual reality system). The disclosure also relates generally to techniques for manufacturing, testing and/or otherwise using such a display panel in various manners.

19 Claims, 8 Drawing Sheets

(56) References Cited

U.S. PATENT DOCUMENTS

| | | | |
|---|---|---|---|
| 2015/0228865 A1* | 8/2015 | Rhee | H01L 27/156 257/90 |
| 2016/0049377 A1* | 2/2016 | Kim | H01L 24/06 257/621 |
| 2017/0092682 A1* | 3/2017 | Choi | H04N 5/3575 |

* cited by examiner

DISPLAY WITH STACKED EMISSION AND CONTROL LOGIC LAYERS

TECHNICAL FIELD

The following disclosure relates generally to a display panel and to techniques for manufacturing and/or using the display panel, such as for an organic light emitting display panel with a silicon substrate and having an emission layer and a separate stacked control logic and driver layer.

BACKGROUND

Demand for displays with heightened performance is increasing, including with the growth of smart phones and high-definition televisions, as well as other electronic devices. The growing popularity of virtual reality and augmented reality systems, particularly those using head mounted displays, has further increased such demand. Virtual reality systems typically envelop a wearer's eyes completely and substitute a "virtual" reality for the actual view (or actual reality) in front of the wearer, while augmented reality systems typically provide a semi-transparent or transparent overlay of one or more screens in front of a wearer's eyes such that actual view is augmented with additional information. In many virtual reality and augmented reality systems, the movement of a wearer of such a head mounted display may be tracked in various manners, such as via sensors in the head mounted display and/or external to it, in order to enable the images being shown to reflect user movements.

However, such head mounted displays, with reduced distance between a viewer's eye and the display and often with a fully obscured field of view, have increased the performance requirements of displays in ways that traditional displays cannot satisfy, let alone to do so at cost-effective levels. Accordingly, needs exist for improved display panels, and for improved techniques for manufacturing and using display panels.

DETAILED DESCRIPTION

Figure 1:
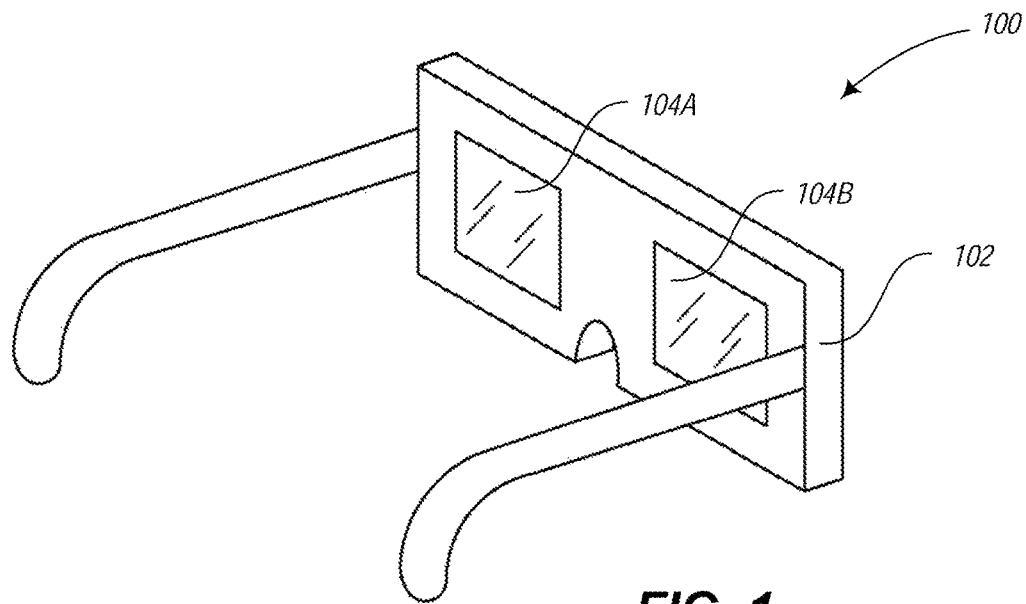
FIG. 1 illustrates a head mounted display system which includes binocular display panels according to an example embodiment of the present disclosure.

The disclosure relates generally to a display panel that is constructed in a particular manner in order to provide various benefits, as discussed in greater detail below. In at least some embodiments, the display panel is produced by combining multiple separate stacked layers or components, such as to have one layer or component (referred to herein at times as an "emission layer" or "emission layer component") with numerous pixels that emit light, and to have at least one other layer or component (referred to herein at times as a "control logic layer" or "control logic layer component") that includes integrated circuits and/or pixel drivers or other logic to control and drive the emission of light by the pixels in the emission layer. In some particular embodiments, the different layers are separate silicon chips or wafers, which are connected in a stacked structure via a flip chip technique, and the emission layer includes OLED ("organic light emitting diodes") pixels to produce light, such as by using active matrix OLED ("AMOLED") techniques. In addition, in at least some embodiments, the display panels are designed and/or configured for use in head mounted displays (e.g., with a fully immersive virtual reality system), including to produce display panels with sizes, pixel resolutions and other operational characteristics that enable a "retinal" level of display, such that a wearer is unable to discern individual pixels at the distances and field of view for such a viewing experience in the head mounted display, while in other embodiments the display panels are designed and/or configured for other uses (e.g., without head mounted displays, without virtual and/or augmented and/or mediated reality uses, etc.). Additional details are included below related to embodiments of the display panel.

The disclosure also relates generally to techniques for manufacturing, testing and/or otherwise using such a display panel, including as part of a head mounted display (e.g., with a fully immersive virtual reality system). The disclosed techniques include techniques for controlling display operations for the display panel in particular manners in at least some embodiments, such as to use low persistence global illumination, to use differing resolutions or illumination amounts for different areas of the display panel (e.g., at different times), etc. In addition, in at least some embodiments, techniques are used for testing display panel components in manners that provide additional benefits, such as to individually test particular emission layer components and/or control logic layer components (optionally with the emission layer components and control logic layer components being produced by different entities in different locations), to comparison test multiple different types of emission layer components with a single type of control logic layer component, to comparison test multiple different types of control logic layer components with a single type of emission layer component, etc. Furthermore, in at least some embodiments, a video interface and/or video information exchange mechanism is used that provides additional capabilities, such as to allow information to be compressed while being transferred, to allow certain pixels or a subset of the display to be omitted from display information instructions that are sent (e.g., with a default behavior to be applied for such omitted subsets of the display panel, such as to not illuminate those subsets), to support circular or oval (e.g., elliptical shapes having a major axis with a first length and having a minor axis with a second length that is at least 50% of the first length) or other non-rectangular shapes of display panels, etc. Additional details are included below related to embodiments of techniques for manufacturing, testing and/or otherwise using a display panel.

Use of the described techniques provides a variety of benefits. For example, decoupling of the front plane pixel emission from the backplane pixel drivers and other control logic, such as via use of an interposer as described herein with respect to at least some embodiments, provides various benefits with respect to production and testing of components. In addition, an ability to segment the backplane allows it to be fabricated silicon within the reticle dimensions of equipment and assembled into arbitrarily large display structures, and use of smaller segments also greatly improves wafer yields and utilization. Corresponding advantages of silicon electron mobility and processing for display fabrication allows a clear and immediate pathway to retinal near eye displays (e.g., dimensions of 10,000×10,000 or more), high dynamic range, greatly improved fill factor, and brightness (e.g., 10,000 cd/m2 or more). In addition, with respect to production of a display panel, significant improvements in pixel density for significantly larger sizes of display panel may be achieved at significantly lower costs (e.g., $50 or less). In addition, the described techniques may provide a variety of benefits with respect to the use of such a display panel, including to provide one or more of the following: increased bandwidth in communication of video signals to the display panel, photorealistic immersive visual experience, correlation of stereo vergence of eyes with lens accommodation, and other improved operation for near-eye use (e.g., for use in head mounted displays with virtual reality and/or augmented reality). Furthermore, the described techniques may provide a variety of benefits in particular situations with respect to testing, including to provide significant improvements with respect to prototype iteration, such as by allowing component testing for separate parts of display (e.g., testing emission layer components separate from the control logic layer components), combinations of different types of emission layer components with a single control logic layer component and/or different types of control logic layer components with a single emission layer component, etc.

For illustrative purposes, some embodiments are described below in which various specific details are included for illustrative purposes, and in some cases some embodiments are simplified for the sake of brevity so as to not illustrate well-known components. For example, in some embodiments discussed below, particular types of display panels (e.g., AMOLED on a silicon substrate) are produced in particular manners (e.g., with separate stacked emission and control layers connected via a flip chip technique) and/or used in particular manners (e.g., as part of a head mounted display for virtual reality and/or augmented reality), including to use particular types of techniques as part of controlling display operations for the display panel (e.g., low persistence global illumination, differing resolutions or illumination amounts for different areas of the display panel, etc.). However, it will be appreciated that the inventive techniques may be used in a wide variety of other situations, some of which are discussed below.

Figure 11:
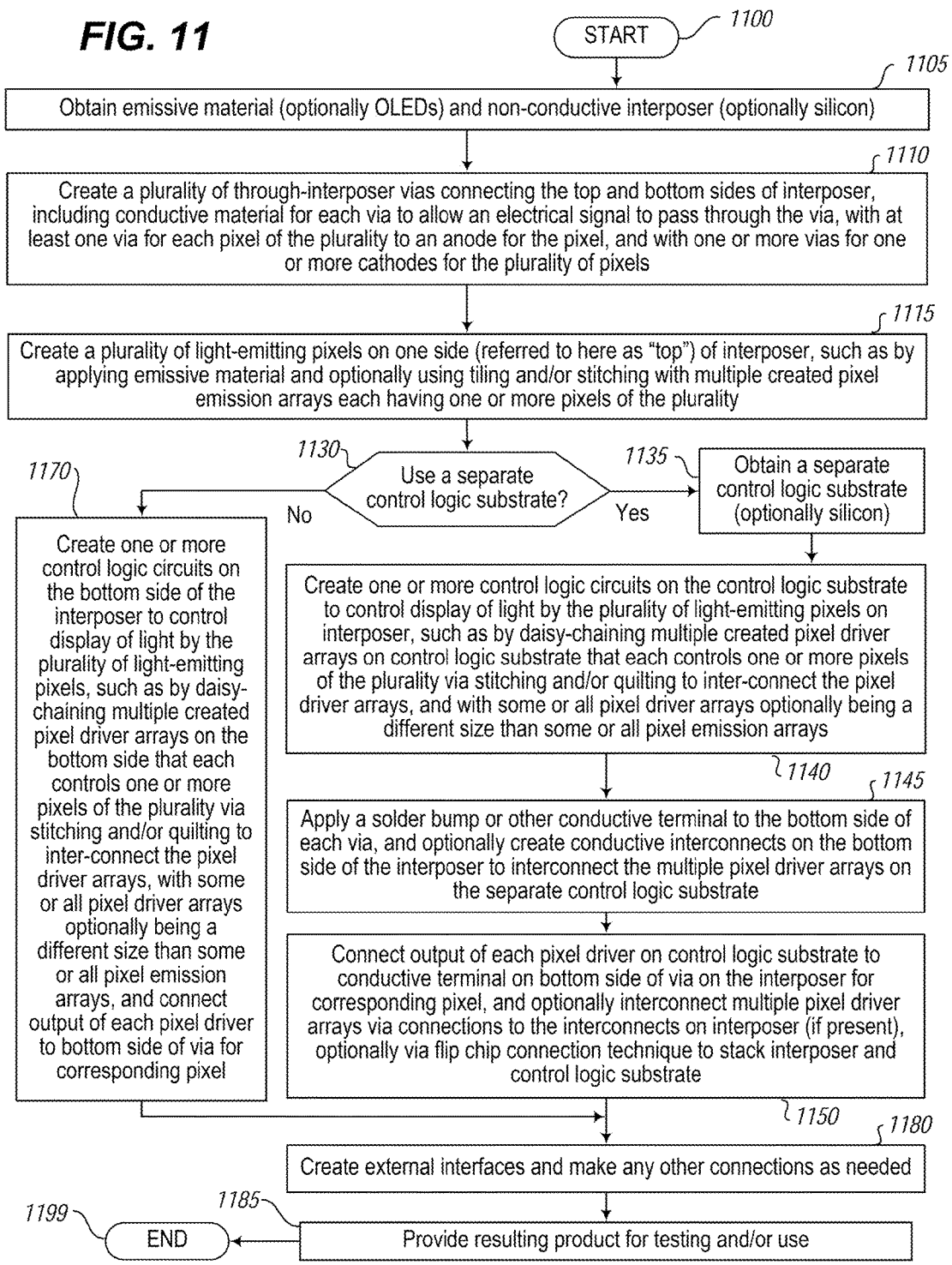
FIG. 11 is a flow diagram of one example embodiment of producing a display panel with separate emission and control layers for use with the described techniques, such as a display panel with stacked emission and control logic layer components connected via a flip chip technique.

FIG. 11 is a flow diagram of one example embodiment of producing a display panel with separate emission and control layers for use with the described techniques, such as a display panel with stacked emission and control logic layer components connected via a flip chip technique. In the illustrated embodiment, a single display panel is described as being created, for the purpose of simplicity, but it will be appreciated that the display panel and its components may be produced in other manners in other embodiments (e.g., by producing multiple components of the same type at a time, in series or in parallel; by producing different components of different types at different times and/or in different locations and/or by different manufacturing entities, such as for blocks 1105-1115 related to the emission layer component and possibly block 1145 to be performed by a single entity and/or at the same time, and for blocks 1140 and 1150 related to the control logic layer component and possibly block 1145 to be performed by a single entity and/or at the same time (possibly a different entity and/or time than for the emission layer component), and to combine them a later time; etc.).

The flow diagram of FIG. 11 begins at block 1100, and proceeds to perform blocks 1105-1115 and 1145 to produce an emission layer component for the display panel. In particular, in blocks 1105-1115, the routine obtains a non-conductive interposer (optionally silicon), for use as a substrate on which an emission material (optionally OLEDs) is to be applied, and creates a plurality of through-interposer vias connecting the top and bottom sides of the interposer (also referred to as 'through-silicon vias' in embodiments in which the interposer is silicon), including adding conductive material for each via to allow an electrical signal to pass through the via. In at least some embodiments, at least one via is associated with each pixel and connected to a voltage terminal of a first type (e.g., an anode terminal) for the pixel, and one or more vias (e.g., around the border of the interposer) are connected to one or more voltage terminals of a second type (e.g., cathode terminals) for the plurality of pixels. As discussed in greater detail below, the first and second types of terminals may be switched in some embodiments and situations, such as when using an inverted emission stack, and thus the first type of voltage terminal may be a cathode terminal and the second type of voltage terminal may be an anode terminal. The routine further obtains and applies the emission material to one side of the interposer to create a plurality of light-emitting pixels on that side (referred to here as "top") of the interposer.

It will be appreciated that the creation of the light-emitting pixels may be performed in various manners in various embodiments. In one embodiment, photolithography is used, with a photoreticle (or "reticle") or other photomask being with a photolithography stepper or scanner to repeatedly produce pixel emission arrays each having one or more pixels across the top surface of the interposer, with the multiple produced pixel emission arrays being tiled on the top surface and together providing the plurality of light-emitting pixels, as well as optionally being interconnected via stitching. As non-limiting illustrative embodiments, a reticle of approximately one inch or less and CMOS (complementary metal-oxide-semiconductor) or nMOS (n-type metal-oxide-semiconductor) construction techniques may be used to create a large display surface (e.g., between 50 millimeters (mm) by 50 mm to 65 mm by 65 mm) with a large number of pixels (e.g., a 2000 ("2K") by 2K AMOLED pixel array and column drivers, a 4K by 4K pixel array and column drivers, etc.), such as with relatively large feature OLED pixels (e.g., a 30 micrometer (um) pixel pitch, with approximately 10 um by 30 um subpixels) using feature sizes of 500 nanometers (nm) or more (e.g., 1 um for a 2K by 2K pixel array, 500 nm for a 4K by 4K pixel array, etc.). Different color subpixels (e.g., RGB) may be produced by using direct emission (via different emission materials) or by using color filters, and using non-Lambertian emission to direct photons to the lens aperture, with a microlens (e.g., an aspheric Fresnel lens) optionally added for each subpixel. A large display surface of this type provides various benefits, including making wide field of view easier, and allows large pixel feature sizes that more easily produce a given level of light output, thus improving lifetime as well as assisting high-dynamic-range (HDR) imaging and high brightness with low persistence, as well as reducing percentage of the non-illuminated borders of the overall area and thus increasing fill factor.

After block 1115, the routine continues to block 1130, where it determines whether a separate control logic substrate is being used, although in some embodiments such a check is not performed (e.g., if a separate control logic substrate is always used or is never used). If it is determined in block 1130 that a separate control logic substrate is being used, the routine proceeds to perform blocks 1140 and 1150 to produce a separate control logic layer component for the display panel. In particular, in block 1135, the routine obtains a separate control logic substrate (optionally silicon) for use with the display panel. After block 1135, the routine continues to block 1140 to create one or more control logic circuits on the control logic substrate to use in controlling display of light by the plurality of light-emitting pixels on the interposer.

It will be appreciated that the creation of the control logic circuits may be performed in various manners in various embodiments. In one embodiment, multiple pixel driver arrays (e.g., each having 3 columns and 3 rows) may be created on the control logic substrate and daisy-chained together via stitching and/or quilting, such as to interconnect the pixel driver arrays by using interconnects on the bottom side of the interposer, although in other embodiments the control logic on its substrate may be created in a monolithic manner without such stitching and/or quilting. Each pixel driver array is designed to control one or more pixels on the emission layer component, and some or all pixel driver arrays may optionally be a different size than some or all pixel emission arrays. As non-limiting illustrative embodiments, relatively small feature sizes may be used to create the control logic circuits, such as 250 nm processes or less (e.g., a 9.6 um RGB stripe pixel pitch using 180 nm processes), in comparison to those used to create the pixel emission arrays on the emission layer component—by having separate emission and control logic layers, significantly different scales and densities can be more easily used for the feature sizes of the pixel emission arrays of the emission layer component and the pixel driver arrays of the control logic layer component. The control logic substrate may further be designed to support mixed mode digital and analog signals, such as for 5 volt and/or 10 volt analog signals.

After block 1140, the routine continues to block 1145 to further prepare the interposer of the emission layer component for connection to the control logic substrate component, by applying a solder bump or other conductive terminal to the bottom side of each via on the interposer and, for embodiments in which the bottom of the interposer is used to stitch or otherwise interconnect different pixel driver arrays on the control logic substrate component, create conductive interconnects on the bottom side of the interposer between appropriate terminals on the interposer. In at least some embodiments, a high density of interconnects (e.g., at least 3 interconnects per row) on the bottom side of the interposer may be used to interconnect the emission layer component and the control logic substrate component. After block 1145, the routine continues to block 1150 to connect the output of each pixel driver on the control logic substrate to the corresponding conductive terminal on the bottom side of the associated via on the interposer for the corresponding pixel to be controlled, and to similarly create the interconnections between the multiple pixel driver arrays on the control logic substrate via connections to the interconnects on the interposer (if present)—in at least some embodiments, flip chip connection techniques are thus used to stack the emission layer component and control logic substrate components.

If it is instead determined in block 1130 that a separate control logic substrate is not being used, the routine instead proceeds to perform block 1170 to create the control logic for the display panel on the bottom side of the interposer, such as in a manner similar to that described with respect to block 1140. In particular, in block 1170, the routine create one or more control logic circuits on the bottom side of the interposer to control display of light by the plurality of light-emitting pixels, such as by daisy-chaining multiple created pixel driver arrays on the bottom side that each controls one or more pixels, and with the output of each pixel driver being connected to the bottom side of the associated via on the interposer for the corresponding pixel to be controlled.

After blocks 1150 or 1170, the routine continues to block 1180 to otherwise prepare the display panel for use, including to create any external interfaces and to make any other connections as needed. After block 1180, the routine continues to block 1185 to provide the resulting display panel for further testing and/or use, and then continues to block 1199 and ends.

While the routine of FIG. 11 is described in some situations as involving OLED pixels on a silicon interposer substrate, it will be appreciated that other types of light emission technologies (e.g., LCD, inorganic LED, etc.) and/or substrates (e.g., gallium arsenide, gallium nitride, etc.) may be used in some embodiments. Nonetheless, embodiments using OLED emission on a silicon substrate provide various benefits, including one or more of the following: high electron mobility relative to low-temperature polycrystalline silicon (LTPS), providing reduced ghosting and illumination plateaus, providing better mura characteristics, having higher brightness than OLED on glass due to delivering a higher drive current, etc.; a high fill factor to reduce "screen door" effect, such as 70% or more (e.g., 75%-85%) relative to approximately 20% on a surface such as glass; providing higher resolutions than OLED on glass, such as with a pixel pitch of between 9 and 10 micrometers by 30 micrometers for each subpixel (e.g., a 9.6 um RGB stripe pixel pitch using 180 nm processes, or more generally 30 micrometers or less for each pixel), including to achieve "retinal" resolution for near-eye displays (e.g., on head mounted displays); etc. While RGB stripes or patterns are discussed in some embodiments, it will be appreciated that other types of pixel colors and patterns may be used in other embodiments, including, but not limited to, RBGW, RGBY, RGBG, PenTile, S-Stripe RGB, etc.

In addition, while the routine of FIG. 11 is described with respect to producing a display panel that may be used for a variety of uses, the routine in some embodiments may further proceed to use the display panel that is produced in various manners, including in some embodiments to use the display panel as the display for one eye in a head mounted display (e.g., for use in virtual reality and/or augmented reality situations and systems). If the display panel is included in such a head mounted display or other enclosing structure, it will be appreciated that the structure may further include various other components (e.g., one or more cameras to record an external environment and optionally display some or all such information on one or more display panels, such as for use in an augmented reality system or other mediated reality system; one or more sensors to track the wearer or other user of the head mounted display or other enclosing structure, such as to track eye movement, head movement, etc.; one or more speakers to provide sound to the ears of the wearer or other user; etc.). The head mounted display or other enclosing structure may further be designed and/or configured to operate together with external components, such as one or more external sensors that track movement and/or other information about the wearer or other user of the head mounted display or other enclosing structure, an external system that supplies video and optionally other information for use by the head mounted display or other enclosing structure (e.g., as part of a virtual reality and/or augmented reality system), etc.

In addition, in some embodiments, displays of other sizes and shapes may be used than those mentioned above, including displays that are circular or oval or otherwise non-rectangular. However, when increasing display sizes beyond approximately 63 mm by 63 mm for each eye, the additional size may in certain situations add only limited additional field of view, based in part on the human inter-pupil distance and other physical constraints of the human eye.

FIG. 1 shows a simplified illustration of a head mounted display system 100 which is wearable on the head of a user for use in virtual reality and/or augmented reality situations and systems. The head mounted display system 100 includes a body 102 that supports two display panels 104A-104B, each of which functions as the display for one eye of the user when the head mounted display system 100 is worn. In some embodiments, rather than the two binocular displays 104A-104B, the head mounted display system 100 may include a single or monocular display panel. Further, although the shape of the display panels 104A-104B are shown as being rectangular, in other embodiments the display panels may be other non-rectangular forms and shapes (e.g., circular, elliptical, etc.). Additionally, although not shown to avoid clutter, the head mounted display system 100 may further include various other components, such as one or more cameras, sensors, user or component interfaces, etc. The head mounted display system 100 may operate together with external components, such as one or more external sensors that track movement and/or other information about the wearer or other user of the head mounted display or other enclosing structure, an external system that supplies video and optionally other information for use by the head mounted display system or other enclosing structure (e.g., as part of a virtual reality and/or augmented reality system), etc.

Figure 2:
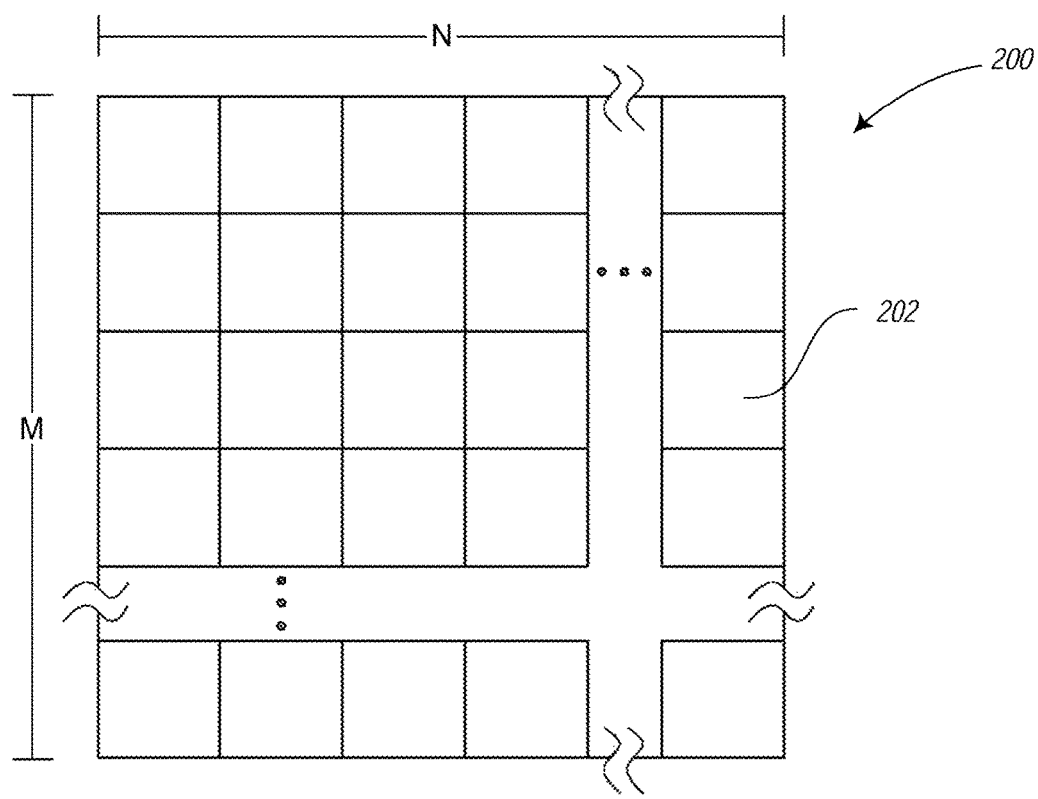
FIG. 2 illustrates a top view of a display panel which includes a plurality of pixels arranged in a grid of M rows and N columns.

FIG. 2 shows a top view of example display panel 200, which may be similar or identical to each of the display panels 104A-104B of FIG. 1. The display panel includes a number of pixels 202 arranged in an array having M rows and N columns, where M and N may be the same or different. As an example, the display panel may be arranged in a 2000×2000 array of pixels, a 4000×4000 array of pixels, 12000×12000 array of pixels, etc. As discussed further below, in some embodiments each pixel 202 in the array may have an OLED having a cathode, an anode, and an emissive layer formed between the cathode and the anode.

Figure 3:
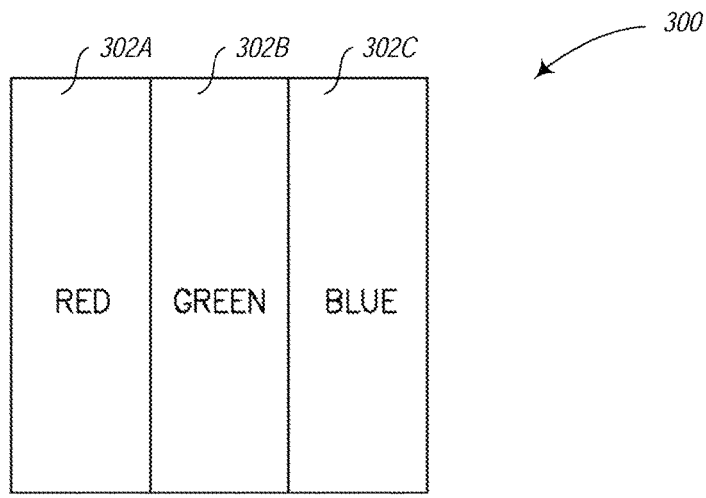
FIG. 3 illustrates a pixel of a display panel which includes a red subpixel, a green subpixel and a blue subpixel.

FIG. 3 shows a top view of a pixel 300 which may be similar or identical to the pixels 202 of the display panel 200 of FIG. 2. In this illustrated embodiment, the pixel 300 comprises three subpixels 302A-302C. The subpixel 302A is configured to emit red light, the subpixel 302B is configured to emit green light, and the subpixel 302C is configured to emit blue light. In at least some embodiments, the pixel 300 may have a 30 um pixel pitch with each of the subpixels 302A-302C being approximately 10 um by 30 um. The different colors for the subpixels 302A-302C may be produced by using direct emission (via different emission materials) or by using color filters, and using non-Lambertian emission to direct photons to the lens aperture, with a microlens (e.g., an aspheric Fresnel lens; SELFOC lens; graded-index, or GRIN, lens; etc.) optionally added for each of the subpixels 302A-302C.

Figure 4:
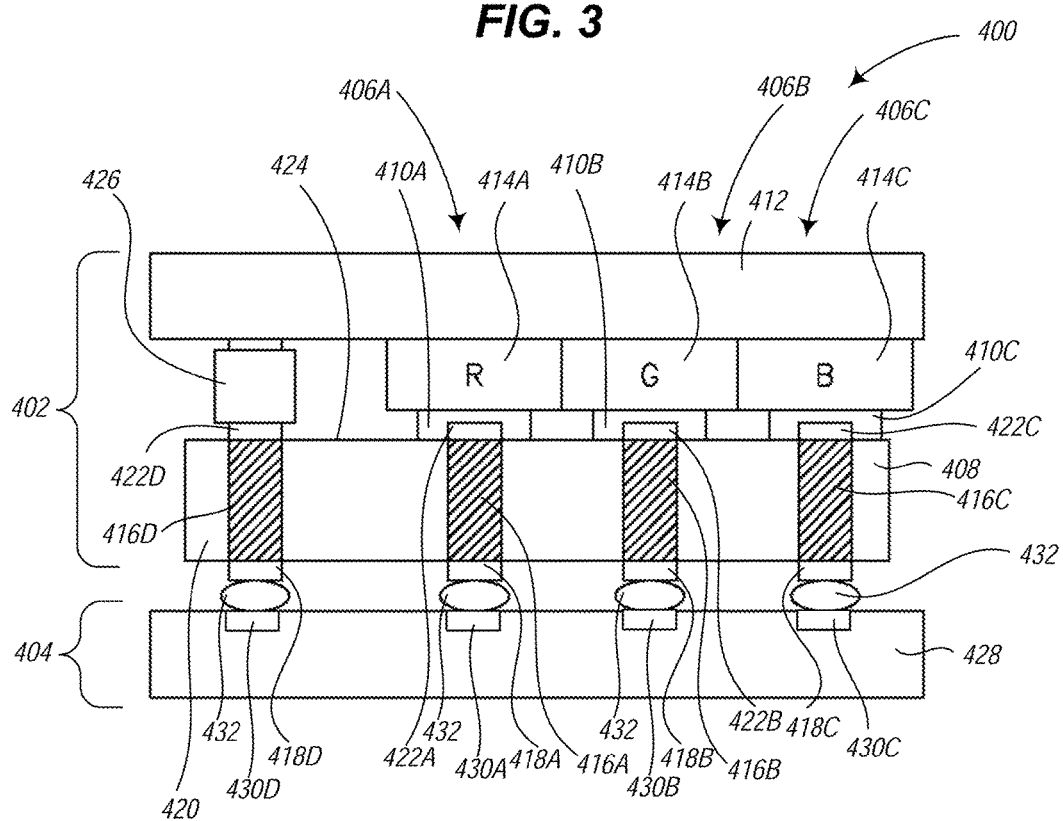
FIG. 4 illustrates a sectional elevational view of a display panel with separate emission and control logic layer components connected via a flip chip technique.

FIG. 4 shows sectional elevational view of a display panel 400 in accordance with one or more embodiments of the present disclosure. The display panel 400 comprises an emission layer component 402 and a control logic layer component 404 coupled together in a stacked relationship via a flip chip connection technique.

The emission layer component 402 comprises a plurality of OLED pixels 406A-406C (collectively pixels 406) disposed on a top side 424 (as shown) of a silicon substrate 408 which functions as a non-conductive interposer. In some embodiments, the interposer 408 may be formed from one or more materials other than silicon (e.g., gallium arsenide, gallium nitride, etc.). Each of the OLED pixels 406A-406C includes respective anode layers 410A-410C, a cathode layer 412 which may be common to the pixels, and respective emissive layers 414A-414C formed between the cathode layer and the anode layers. For explanatory purposes, FIG. 4 shows three subpixels, namely, a red subpixel 414A, a green subpixel 414B, and a blue subpixel 414C.

The anode layers or pads 410A-410C and the cathode layer 412 are formed from a conductive material, such as indium-tin-oxide (ITO) or indium zinc oxide (IZO). The cathode layer 412 is formed on the emissive layers 414A-414C. The emissive layers 414A-414C may each include one or more layers, such as an electron transport layer, a hole transport layer, an organic emissive layer, etc.

The interposer 408 includes a plurality of through-silicon vias (TSVs) 416A-416D (collectively TSVs 416) which each provide a vertical electrical connection (via) passing completely through the interposer between the top side and the bottom side thereof. Each of the TSVs 416 may include a respective electrical input terminal 418A-418D on a bottom side 420 of the interposer and an electrical output terminal 422A-422D on the top side 424 of the interposer to provide electrical connections between components.

Figure 6:
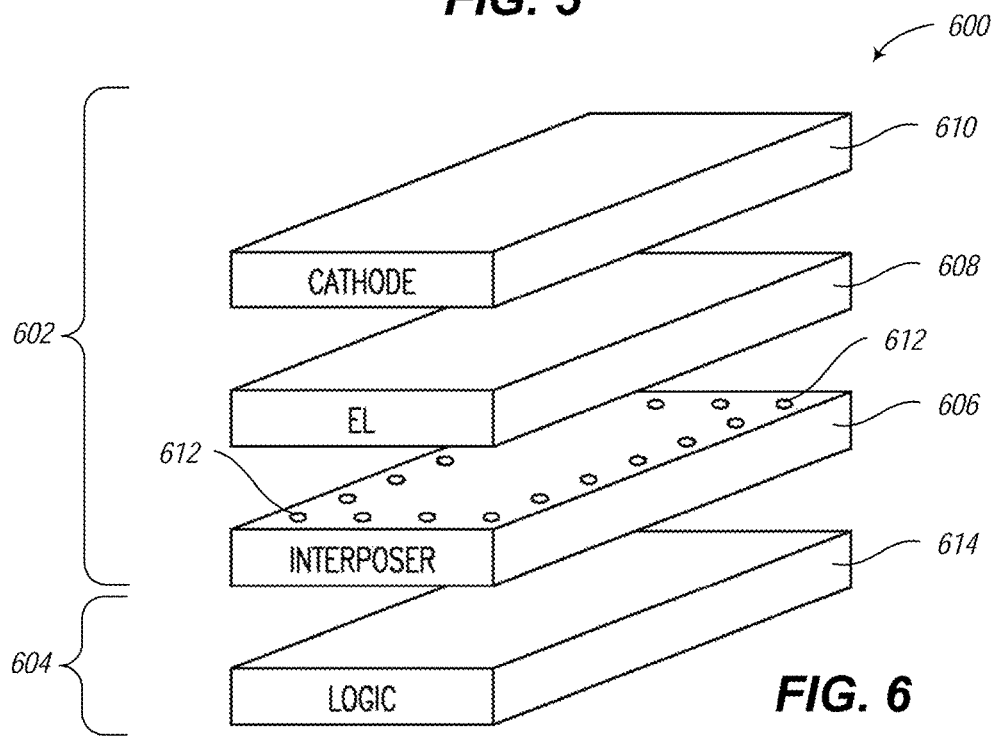
FIG. 6 illustrates a perspective view of selected layers of a display panel which includes an interposer layer having a plurality of through-interposer vias disposed around a border thereof for electrical connection to a cathode layer of the display panel.

Each of the pixels 406A-406C has a respective TSV 416A-416C associated therewith. The output terminals 422A-422C of the TSVs 416A-416C, respectively, are electrically coupled to the anodes 410A-410C, respectively, of the respective pixels 406A-406C. The interposer 408 may also include one or more TSVs 416D (e.g., around the border of the interposer as shown in FIG. 6) which are connected to the cathode layer 412 for the plurality of pixels 406 by a suitable conductive connector 426.

The control logic layer component 404 comprises a substrate 428 (e.g., silicon, gallium arsenide, gallium nitride, etc.) which includes one or more control logic circuits thereon which drive or control the display of light by the plurality of pixels 406 on the interposer 408. The substrate 428 includes a plurality of pads 430A-430D which may be electrically connected to corresponding input terminal pads 418A-418D of the interposer by solder bumps 432. During manufacturing, the solder bumps 432 may be deposited onto the input terminal pads 418A-418D on the bottom side 420 of the interposer 408 while the interposer is flipped so the bottom side (as shown) faces upward. To mount the interposer 408 onto the control logic layer substrate 428, the interposer may be flipped over so that the bottom side 420 faces downward, and aligned so that its input pads 418A-418D align with matching pads 430A-430D on the control logic layer substrate. The solder bumps 432 may then be reflowed to complete the interconnections between the interposer 408 and the control logic layer substrate 428.

As discussed above, in some embodiments a high density of interconnects on the bottom side 420 of the interposer 408 may be used to interconnect the emission layer component 402 and the control logic substrate component 404. In particular, the control logic substrate 428 may include a pixel driver circuit for each pixel 406, and the output of each pixel driver circuit may be electrically coupled to the anode 410 of a corresponding pixel by one of the TSVs 416 of the interposer 408 to control the pixel.

Figure 5:
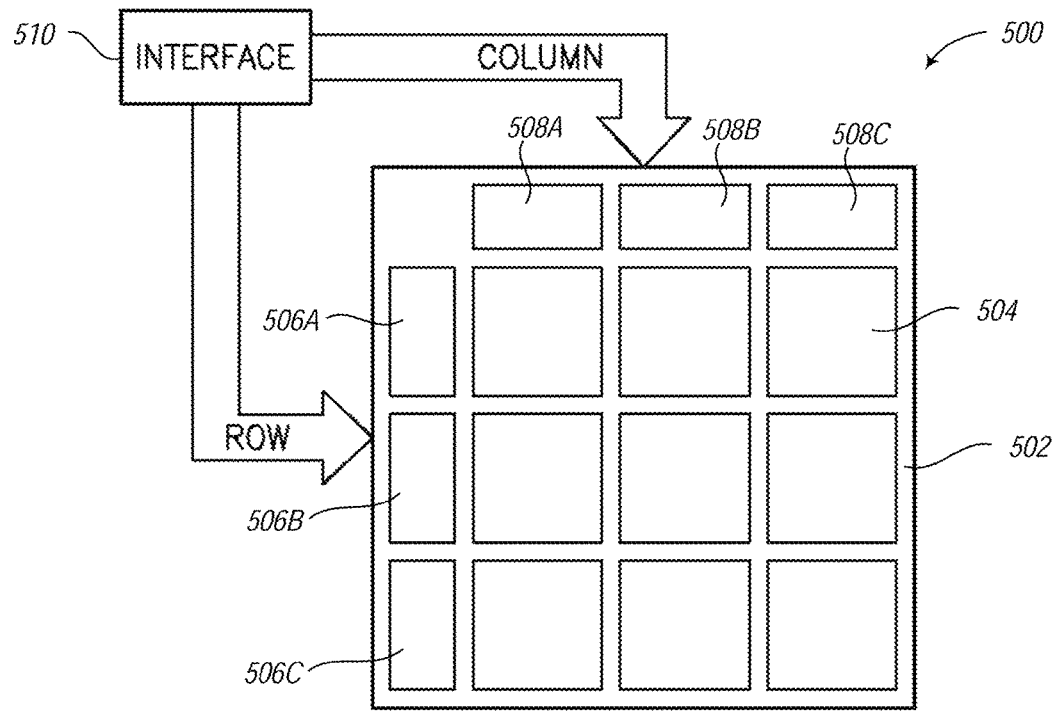
FIG. 5 illustrates a top view of a control logic layer component of a display panel which includes multiple pixel driver arrays, row driver circuits, column driver circuits, and an interface.

FIG. 5 shows a top view of a control logic layer component 500 which includes a substrate 502 and multiple pixel driver arrays 504 thereon arranged in a grid having three columns and three rows. The pixel driver arrays 504 may be daisy-chained together via stitching and/or quilting in the illustrated example, such as to inter-connect the pixel driver arrays by using interconnects on the bottom side of an interposer (see FIG. 8)—in other embodiments, the pixel driver arrays may be created on the backplane control logic layer component in other manners, as discussed in greater detail elsewhere herein. Each pixel driver array 504 controls one or more pixels on the emission layer component, and some or all pixel driver arrays may optionally be a different size than some or all pixel emission arrays. Each pixel driver array 504 in a row of pixel driver arrays may be coupled to a respective row driver circuit 506A-506C, and each pixel driver array in a column of pixel driver arrays may be electrically coupled to a respective column driver circuit 508A-508C. The row driver circuits 506 and the column driver circuits 508 may be communicatively coupled to a suitable interface 510 (e.g., HDMI, DisplayPort) which provides row/column data to control the row and column driver circuits 506 and 508. As discussed below with reference to FIG. 10, in some embodiments the pixel driver arrays 504 and the row driver circuits 506 may be disposed on the control logic layer component (see FIG. 4), and the pixel arrays and column driver circuits 508 may be disposed on the emission layer component.

In some embodiments, relatively small feature sizes may be used to create the control logic circuits in comparison to those used to create the pixel emission arrays on the emission layer component. As discussed above, by having separate emission and control logic layers, significantly different scales and densities can be more easily used for the feature sizes of the pixel emission arrays of the emission layer component and the pixel driver arrays of the control logic layer component. The control logic substrate may further be designed to support mixed mode digital and analog signals, such as for 5 volt and/or 10 volt analog signals.

FIG. 6 illustrates a simplified perspective view of selected layers of a display panel 600 which include a separate emission layer component 602 and a control logic layer component 604. Similar to the embodiments discussed above, the emission layer component 602 includes an interposer 606, an anode layer (not shown for clarity), an emissive layer 608, and a cathode layer 610. As shown, the interposer 606 includes a plurality of TSVs 612 disposed around the border thereof which may be connected to the cathode layer 610 for the plurality of pixels of the display panel 600 by suitable conductive connectors (e.g., conductive connector 426 of FIG. 4). The control logic layer component 604 includes a substrate 614 which has a plurality of pixel driver array circuits thereon, as discussed above. Thus, in some embodiments, the interposer 606 includes a TSV for the anode of each pixel to couple pixel driver circuits to each anode, and a ring or border of TSVs 612 to couple pixel driver array circuits to the cathode layer 610, which may be shared by some or all of the pixels of the display panel 600.

Figure 7:
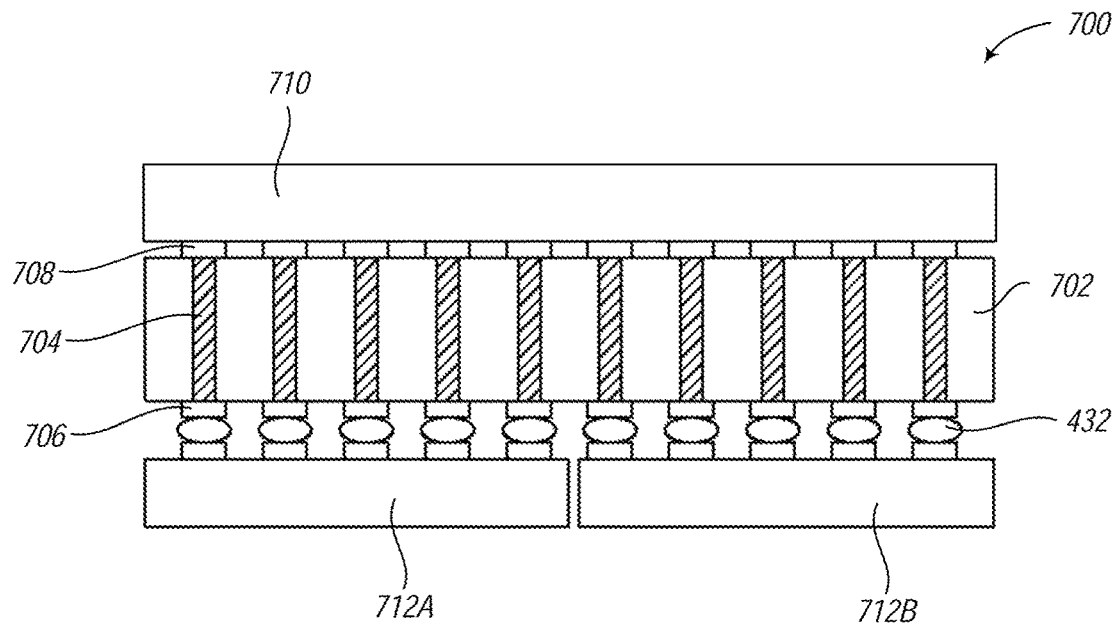
FIG. 7 illustrates a sectional elevational view of a display panel which includes multiple emission layer components disposed on a top side of an interposer and multiple control logic layer components disposed on a bottom side of the interposer and connected thereto by a flip chip technique.

FIG. 7 illustrates a display panel 700 which comprises an interposer 702 having a plurality of TSVs 704, each having corresponding input terminals 706 and output terminals 708. The display panel 700 includes multiple pixel emission arrays 710 on the top side of the interposer and together providing the plurality of light-emitting pixels, as well as optionally being interconnected via tiling and/or stitching, or instead being created in a monolithic manner. The display panel 700 also includes multiple pixel driver arrays 712A-712B which may be daisy-chained together via stitching and/or quilting, such as to inter-connect the pixel driver arrays by using interconnects on the bottom side of the interposer 702 (see FIG. 8).

Figure 8:
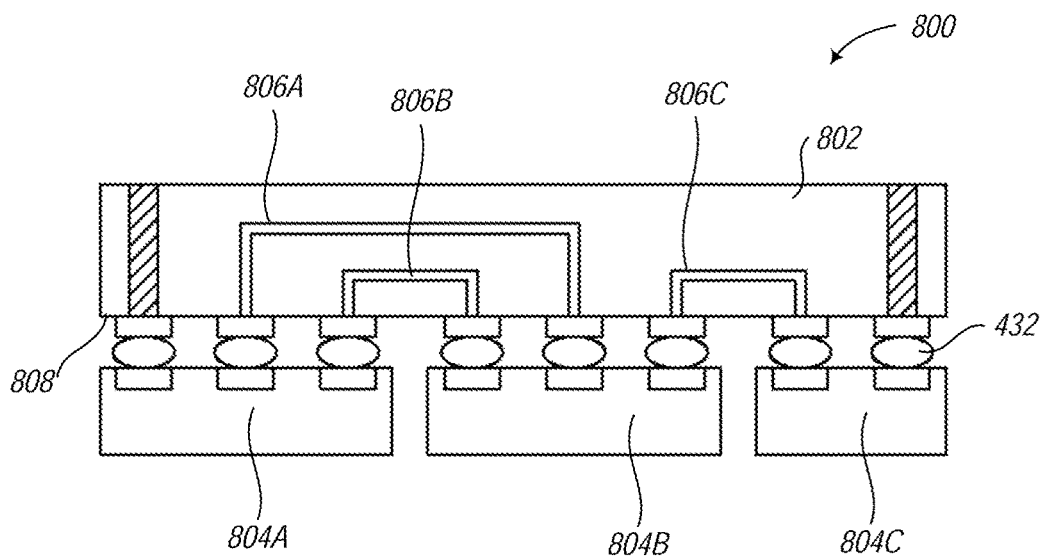
FIG. 8 illustrates a sectional elevational view of a portion of a display panel which includes an interposer and multiple control logic layer components quilted together by interconnects disposed on a bottom surface of the interposer.

FIG. 8 shows a portion of a display panel 800 which includes an interposer 802 and multiple pixel driver arrays 804A-804C. The interposer 802 may have a plurality of interconnects 806A-806C on a bottom side 808 thereof which may be used to inter-connect the multiple pixel driver arrays 804A-804C. The interconnects 806 are shown above the bottom side 808 of the interposer 802 in FIG. 8 for clarity, but it should be appreciated that in some embodiments the interconnects 806 may be disposed directly on a bottom surface of the bottom side 808 of the interposer 802.

Figure 9:
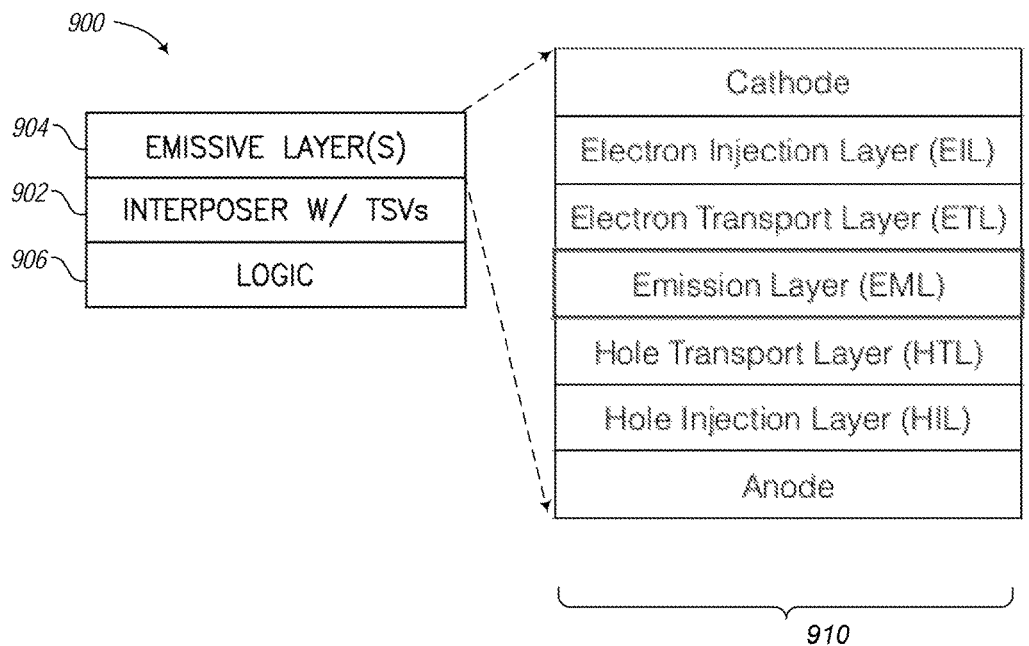
FIG. 9 illustrates layers of a display panel which include an interposer, one or more emissive layers disposed on a top side of the interposer, and a control logic layer disposed on a bottom side of the interposer.

FIG. 9 shows a display panel 900 according to an embodiment of the present disclosure which includes an interposer 902 having a plurality of TSVs therethrough, as discussed above, emissive layers 904 (e.g., OLED emissive layers) disposed on a top side of the interposer 902, and a control logic layer component 906 disposed directly on the bottom side of the interposer. In addition, one example of multiple emissive layers 910 is illustrated in expanded view to the right, and includes (from top to bottom) a cathode layer, electron injection layer, electron transport layer, emission layer, hole transport layer, hole injection layer and anode layer. It will be appreciated that the illustrated types of layers 910 may be arranged in other manners (e.g., as an inverted stack, with the cathode at the bottom and anode at the top and other layers moved in a respective manner), that other embodiments may include more or less layers than are illustrated, and/or that other types of emission technologies and structures can be used for the emissive layer(s) in other embodiments. In addition, control logic circuits may be positioned on the bottom side of the interposer 902 to control display of light by the plurality of light-emitting pixels in the emissive layer(s) 904, such as by daisy-chaining multiple created pixel driver arrays (see FIG. 8) on the bottom side of the interposer that each controls one or more pixels, and with the output of each pixel driver being connected to the bottom side of the associated TSV on the interposer 902 for the corresponding pixel on the emissive layer 904 to be controlled.

Figure 10:
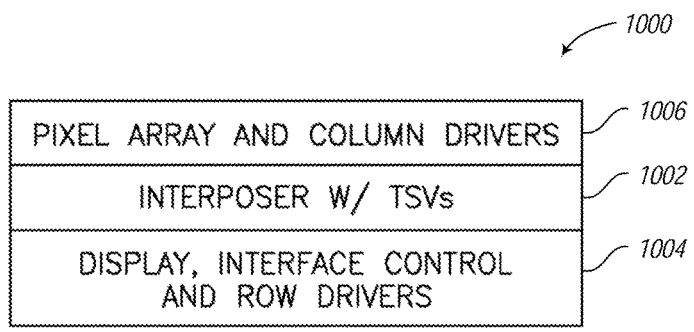
FIG. 10 illustrates layers of a display panel which include an interposer, a lower layer component which includes control logic and row driver circuits, and an upper layer component which includes one or more pixel arrays and one or more column driver circuits.

FIG. 10 show another embodiment of a display panel 1000 which includes an interposer 1002 having a plurality of TSVs therethrough, as discussed above. In this embodiment, a lower or control logic layer component 1004 may include pixel driver arrays and row driver circuits (see FIG. 4), and an upper or emission layer component 1006 may include pixel arrays and column driver circuits of the display panel 1000. The lower or control logic layer component 1004 may be applied directly to the bottom side of the interposer 1002, similar to the embodiment of FIG. 9, or may be a separate die which is coupled to the interposer by a flip chip technique, as discussed above with reference to FIGS. 4, 7 and 8.

Figure 12:
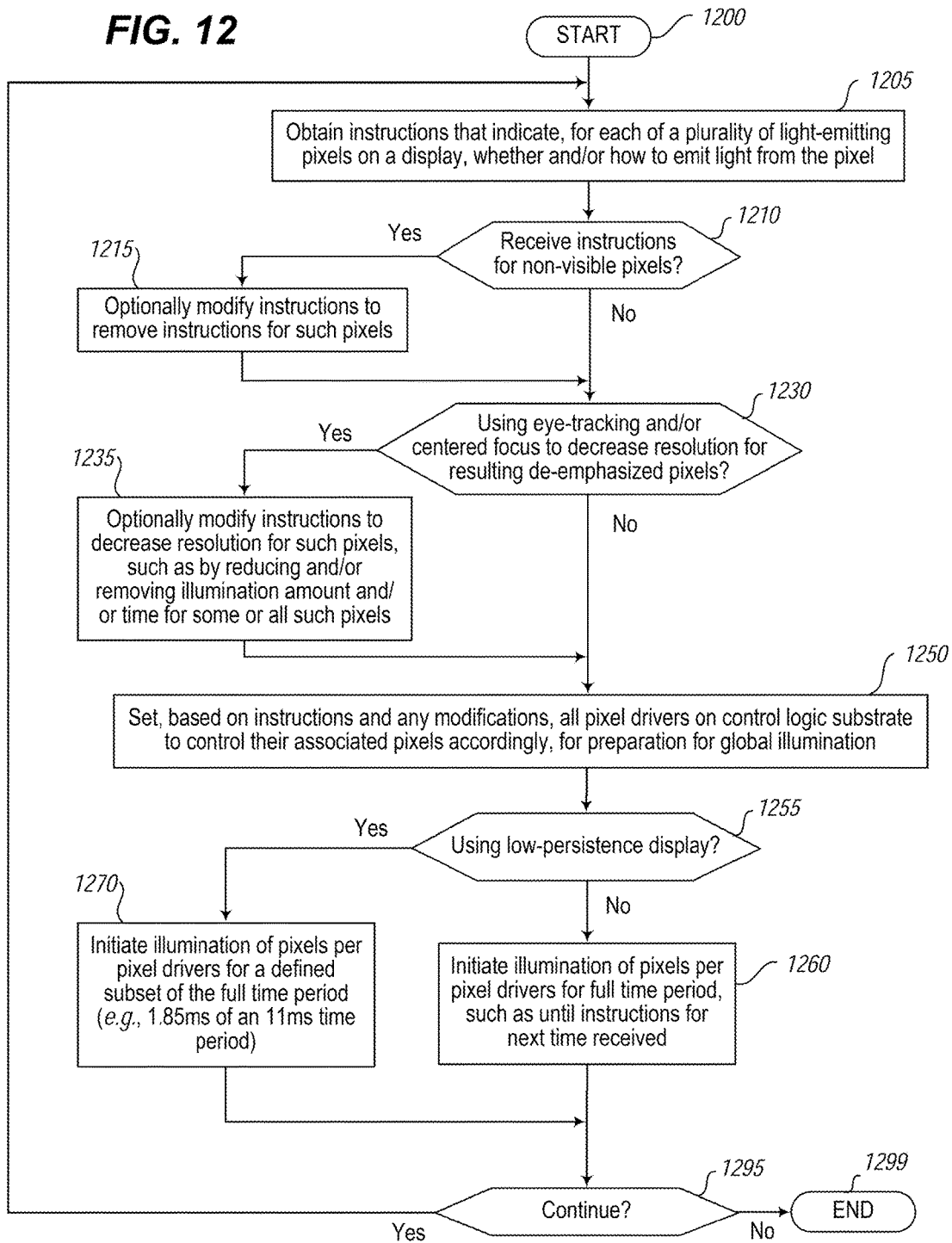
FIG. 12 is a flow diagram of one example embodiment of using a display panel with separate emission and control layers to implement some of the described techniques, such as a display panel with stacked emission and control logic layer components connected via a flip chip technique.

FIG. 12 is a flow diagram of one example embodiment of using a display panel with separate emission and control layers to implement some of the described techniques, such as a display panel with stacked emission and control logic layer components connected via a flip chip technique. In the illustrated embodiment, a single display panel is described as being controlled, for the purpose of simplicity, but it will be appreciated that multiple display panels may be used together in other manners in other embodiments (e.g., by using two display panels, one for each eye, as part of a head mounted display). In addition, while the illustrated embodiment discusses performing the display for a given point of time, with the capability to repeatedly loop and perform each of multiple successive times, it will be appreciated that other display techniques may use information from multiple display frames or cycles in other manners in other embodiments.

The flow diagram of FIG. 12 begins at block 1200, and proceeds to perform block 1205, where it obtain instructions that indicate, for each of a plurality of light-emitting pixels on a display, whether and/or how to emit light from the pixel at a given time (e.g., the next display frame or cycle). After block 1205, the routine continues to block 1210, where it determines whether it has received instructions for any non-visible pixels (e.g., if a rectangular display panel is being used for a circular or oval display, such that some pixels in the corners are not visible). If it is determined in block 1210 that instructions are received for non-visible pixels, the routine continues to block 1215, where it optionally modifies the instructions to remove any instructions for such pixels, thus avoiding the time and power for illuminating pixels that are not visible.

After block 1215, or if it was instead determined in block 1210 that instructions were not received for non-visible pixels (e.g., if there are not any non-visible pixels, or if a video interface is used that allows instructions to be provided for only a subset of the pixels), the routine continues to block 1230 where it determines whether variable pixel resolution is being used, such as to allow resolution to be decreased for parts of the display that are not the current focus of the user (e.g., if eye tracking is used to determine where a user's eye is focused, if it is assumed that the user's eye is focused on or near the center of the display, etc.). If it is determined in block 1230 that such variable pixel resolution is being used, the routine continues to block 1235, where it optionally modifies the instructions to change them for such pixels that are not the current focus of the user, thus avoiding the time and power for fully illuminating all pixels that are not the current focus. Such reduction for variable pixel resolution may include, for example, reducing and/or removing the amount of illumination and/or corresponding data for some or all such pixels that are not the current focus of the user, such as to create one or more groups each having multiple nearby pixels (e.g., 25 pixels, 400 pixels, etc.) and use data for a single pixel to control all of the pixels in a particular group in the same manner.

After block 1235, or if it is instead determined in block 1230 that such variable pixel resolution is not being used, the routine continues to block 1250, where it sets, based on the obtained instructions and any modifications to them, the pixel drivers on the control logic substrate component to control their associated pixels accordingly, in preparation for global illumination. After block 1250, the routine continues to block 1255 to determine whether a low-persistence display technique is being used in the current embodiment, such that the illumination will be performed for only a subset of the display time period or cycle, although in at least some embodiments such a low-persistence display technique will always be used or will never be used, such that a dynamic determination is not made at the time of operation. If it is determined in block 1255 that a low-persistence display technique is not being used, the routine continues to block 1260, where it initiates illumination of the pixels on the emission layer component per the settings of the corresponding pixel drivers for the full time period, such as until instructions for next display cycle are received or implemented. If it is instead determined in block 1255 that a low-persistence display technique is being used, the routine continues instead to block 1270, where it initiates illumination of the pixels on the emission layer component per the settings of the corresponding pixel drivers for only a subset of the full time period (e.g., for only 1.85 milliseconds of an 11 millisecond time period).

After blocks 1260 or 1270, the routine continues to block 1295, where it determines whether to continue, such as until an indication to terminate is received. If it is determined to continue, the routine returns to block 1205, and otherwise continues to block 1299 and ends.

As non-limiting illustrative embodiments, the display operations may be performed to provide variable pixel resolution and/or illumination across the display, including one or more of the following: lower resolution at the periphery of the visible field of view and/or at parts of the visible field of view away from a current focus of the wearer's eye(s), including to provide foveated rendering or other rendered optimizations based on tracking the eye(s) of the viewer (e.g., a wearer of a head mounted display); with lower or no illumination for parts of the display that are outside the wearer's visible field of view, such as due to physical obstruction of a head mounted display optical aperture; etc.) and optionally with circular or oval or other non-rectangular display shapes (e.g., to reflect an optical aperture of a head mounted display); etc. In addition, the display operations for the display panel may be performed using one or more of the following: at 90 frames per second or higher; using global illumination to eliminate "rolling shutter" motion artifacts from rolling illumination bands and/or low persistence illumination (e.g., approximately 1.85 milliseconds per 11 millisecond frame, with approximately 9.25 milliseconds used for frame latency to fill the illumination information of the pixel drivers of the control logic backplane, corresponding to approximately 20 milliseconds of overall latency) to reduce motion blur (e.g., using 160 candela per meter squared illumination levels, 500-10000 candela per meter squared illumination levels, etc.); using fast and complete pixel transitions; using high-dynamic-range imaging to produce a large dynamic range of luminosity (e.g., using 500 candela per meter squared illumination levels, 2000 candela per meter squared illumination levels, etc.); using color purity to aid software chromatic aberration correction; aliasing artifacts from visible subpixels or pentile; using a non-constant pixel fill rate to reduce latency; operating without use of polarizers; operating to satisfy and/or exceed the NTSC/Adobe RGB standard and/or the Rec 2020 standard; etc. Furthermore, the display operations may include improved operations with respect to transferring data over a video (or audio/video) interface and underlying bus or other transport mechanism (e.g., to provide a bus using an interface separate from MIPI, or Mobile Industry Processor Interface, that eliminates bridge ICs and dependencies on them and that is faster than MIPI), such as by reducing power and/or computational levels without corresponding performance reductions, including one or more of the following: to allow signals to be compressed, to allow illumination instructions to be provided for only a subset of the display (e.g., to allow instructions to be eliminated for non-visible portions of the display, and with the display operations including handling pixels without corresponding illumination instructions by providing no illumination for those pixels or otherwise manipulating them in a defined manner), etc.

Figure 13:
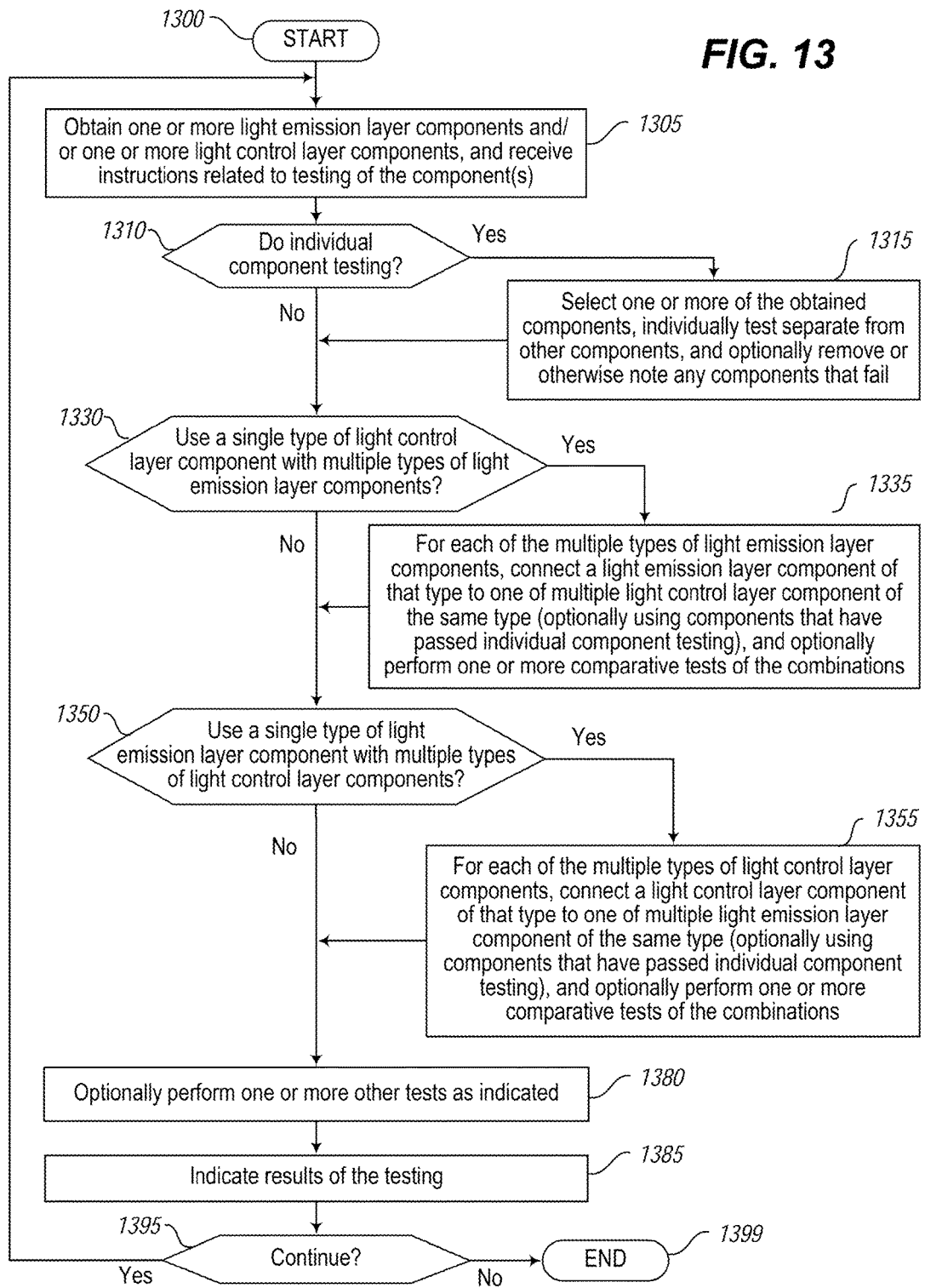
FIG. 13 is a flow diagram of one example embodiment of testing components used to produce a display panel with separate emission and control layers, such as a display panel with stacked emission and control logic layer components connected via a flip chip technique.

FIG. 13 is a flow diagram of one example embodiment of testing components used to produce a display panel with separate emission and control layers, such as a display panel with stacked emission and control logic layer components connected via a flip chip technique.

The flow diagram of FIG. 13 begins at block 1300, and proceeds to perform block 1305, wherein it obtains one or more light emission layer components and/or one or more light control logic layer components, and receives instructions related to testing of the component(s). It will be appreciated that the components may be obtained and used at various times, such as an intermediate step during the flow diagram of FIG. 11 for producing a display panel, and with the light emission layer component(s) and light control logic layer component(s) optionally being produced by blocks 1105-1115 and 1145 of FIG. 11 and blocks 1140 and 1150 of FIG. 11, respectively.

After block 1305, the routine continues to block 1310, where it determines whether to do individual component testing on one or more of the obtained components. If it is determined in block 1310 to do individual component testing on one or more of the obtained components, the routine continues to block 1315, where it individually performs such component testing on each of those components, optionally selecting some or all of the components to test if particular corresponding instructions are not received in block 1305. It will be appreciated that individual component testing may be performed in various manners in various embodiments, including by using specialized testing machinery (e.g., a bed of nails tester), by combining a component to be tested with another complementary component (e.g., temporarily) that is known to be good, etc. In addition, any components that fail may be removed from further use (e.g., optionally sent for repair) or otherwise noted.

After block 1315, or if it is instead determined in block 1310 not to do individual component testing on any of the obtained components, the routine continues to block 1330, where it determines whether to use a single type of light control layer component with multiple types of light emission layer components (e.g., to compare an OLED display with an inorganic LED or LCD display, to compare an OLED display on a first type of substrate with another OLED display on a different second type of substrate, to compare an OLED display using a first feature size for its pixels with another OLED display using a different second feature size for its pixels, etc.). If it is determined in block 1330 to use a single type of light control layer component with multiple types of light emission layer components, the routine continues to block 1335 where, for each of the multiple types of light emission layer components, a light emission layer component of that type is connected to one of multiple light control logic layer components of the same type (optionally using components that have passed individual component testing in block 1315), and optionally performs one or more automated and/or manual comparative tests of the combinations, with corresponding results being stored or otherwise used.

After block 1335, or if it is instead determined in block 1330 not to use a single type of light control layer component with multiple types of light emission layer components, the routine continues to block 1350, where it determines whether to use a single type of light emission layer component with multiple types of light control logic layer components (e.g., to compare a control logic layer component using a first feature size for its pixel driver arrays and/or a first type of connection between sub-components, with another control logic layer component using a different second feature size for its pixel driver arrays and/or a different second type of connection between sub-components). If it is determined in block 1350 to use a single type of light emission layer component with multiple types of light control logic layer components, the routine continues to block 1355 where, for each of the multiple types of light control logic layer components, a light control logic layer component of that type is connected to one of multiple light emission layer components of the same type (optionally using components that have passed individual component testing in block 1315), and optionally performs one or more automated and/or manual comparative tests of the combinations, with corresponding results being stored or otherwise used.

After block 1355, or if it is instead determined in block 1350 not to compare a single type of light emission layer component with multiple types of light control logic layer components, the routine continues to block 1380 to optionally perform one or more other tests as indicated in the instructions received in block 1305. After block 1380, the routine continues to block 1385, where it indicates results of the testing.

After block 1385, the routine continues to block 1395, where it determines whether to continue, such as until instructions to terminate are received. If it is determined to continue, the routine returns to block 1305, and otherwise continues to block 1399 and ends.

It will be appreciated that in some embodiments the functionality provided by the routines discussed above may be provided in alternative ways, such as being split among more routines or consolidated into fewer routines. Similarly, in some embodiments illustrated routines may provide more or less functionality than is described, such as when other illustrated routines instead lack or include such functionality respectively, or when the amount of functionality that is provided is altered. In addition, while various operations may be illustrated as being performed in a particular manner (e.g., in serial or in parallel) and/or in a particular order, those skilled in the art will appreciate that in other embodiments the operations may be performed in other orders and in other manners. It will similarly be appreciated that the data structures discussed above may be structured in different manners, including for databases or user interface screens/pages or other types of data structures, such as by having a single data structure split into multiple data structures or by having multiple data structures consolidated into a single data structure. Similarly, in some embodiments illustrated data structures may store more or less information than is described, such as when other illustrated data structures instead lack or include such information respectively, or when the amount or types of information that is stored is altered.

From the foregoing it will be appreciated that, although specific embodiments have been described herein for purposes of illustration, various modifications may be made without deviating from the spirit and scope of the invention. In addition, while certain aspects of the invention are presented at times in certain claim forms, or may not be embodied in any claims at some times, the inventors contemplate the various aspects of the invention in any available claim form. For example, while only some aspects of the invention may be recited at a particular time as being embodied in a computer-readable medium, other aspects may likewise be so embodied.

What is claimed is:

1. A display panel comprising:
   a silicon substrate having a top surface and a bottom surface, wherein the silicon substrate includes a plurality of through-silicon vias between the top and bottom surfaces, and wherein each of the through-silicon vias has an electrical input on the bottom surface and an electrical output on the top surface that are connectively coupled;
   an active matrix organic light emitting diode (AMOLED) emissive surface attached to the top surface and including multiple pixels that are active matrix organic light emitting pixels, wherein each of the pixels is associated with at least one first through-silicon via of the plurality whose electrical output on the top surface is connectively coupled to a first voltage terminal for the pixel that is one of an anode terminal or a cathode terminal, and wherein one or more other second through-silicon vias of the plurality have electrical outputs on the top surface that are connectively coupled to one or more second voltage terminals for the multiple pixels, wherein the one or more second voltage terminals are cathode terminals if the first voltage terminals are anode terminals and are anode terminals if the first voltage terminals are cathode terminals; and
   one or more control logic circuits that are separate from the silicon substrate and are connectively coupled to the electrical inputs of the through-silicon vias on the bottom surface, wherein in operation the control logic circuits control display of light from the multiple pixels by, for each of the multiple pixels, applying electrical current to the at least one first through-silicon via associated with the pixel.

2. The display panel of claim 1 wherein the silicon substrate and the AMOLED emissive surface form a first layer, wherein the one or more control logic circuits are part of a different second layer on a second silicon substrate, and wherein the first layer and the second layer are joined in a stacked structure using the electrical inputs of the through-silicon vias on the bottom surface of the silicon substrate.

3. The display panel of claim 2 wherein each of the plurality of through-silicon vias further has a conductive material between the electrical input on the bottom surface of the silicon substrate and the electrical output on the top surface of the silicon substrate, and has a solder bump formed on the electrical input on the bottom surface of the silicon substrate for use in forming the joined stacked structure.

4. The display panel of claim 3 wherein some of the through-silicon vias are further connected together using conductive interconnects on the bottom surface of the silicon substrate between the solder bumps for the some through-silicon vias.

5. The display panel of claim 4 wherein joining of the first layer and the second layer in the stacked structure is performed using a flip chip connection between the solder bumps on the bottom surface of the silicon substrate and corresponding electrical connections on the second layer, and wherein the conductive interconnects between the solder bumps for the some through-silicon vias are configured to, in operation, interconnect some control logic subcomponents on the second layer that are connected to the solder bumps for the some through-silicon vias.

6. The display panel of claim 1 wherein the multiple pixels are each a subpixel configured to, in operation, emit light of one of red, green or blue from use of different emissive materials or use of different color filters.

7. The display panel of claim 6 wherein each of the multiple pixels further has an attached lens to direct light emitted from the pixel.

8. The display panel of claim 1 wherein the one or more second through-silicon vias are arranged around at least some of a perimeter of the silicon substrate.

9. The display panel of claim 1 wherein the one or more control logic circuits are formed on a second silicon substrate separate from the silicon substrate, and include multiple pixel drivers on the second silicon substrate that are each coupled to one of the multiple pixels to control the display of light from that coupled pixel.

10. The display panel of claim 9 wherein the multiple pixel drivers are created using a plurality of pixel driver arrays that are individually formed on the second silicon substrate using feature sizes of 250 nanometers or less, and wherein the plurality of pixel driver arrays are stitched together based at least in part on interconnections formed on the bottom surface of the silicon substrate.

11. The display panel of claim 10 wherein the multiple pixels are created on the top surface of the silicon substrate using a plurality of pixel emission arrays that together form at least a 2000 pixel by 2000 pixel display area with a fill factor of at least 70% and that are individually formed using feature sizes of 500 nanometers or more and a pixel pitch of 30 micrometers or less for each pixel, and wherein the plurality of pixel emission arrays are tiled on the top surface of the silicon substrate.

12. The display panel of claim 1 wherein the one or more control logic circuits are formed on a second silicon substrate separate from the silicon substrate, and wherein the silicon substrate and the second silicon substrate are each formed in an elliptical shape having a major axis and having a minor axis with a length that is at least 50% of a length of the major axis.

13. The display panel of claim 1 wherein the display panel is integrated with a head mounted display in which the display panel provides illumination to an eye of a wearer of the head mounted display.

14. The display panel of claim 13 wherein the head mounted display further has a second display panel to provide illumination to a second eye of the wearer, and wherein the display panel is further configured to, in operation, display images to the wearer for a virtual reality system connectively coupled to the head mounted display.

15. A head mounted display comprising:
one or more display panels that each has a light emission layer on a first substrate and has a control logic layer on a second substrate connected to the light emission layer,
wherein the light emission layer includes a plurality of through-interposer vias between top and bottom surfaces of the first substrate and has multiple light-emitting pixels on the top surface, wherein each of the through-interposer vias has an electrical input on the bottom surface and an electrical output on the top surface that are connectively coupled, wherein each of the pixels is associated with at least one first through-interposer via of the plurality whose electrical output on the top surface is connectively coupled to a first voltage terminal for the pixel that is one of an anode terminal or a cathode terminal, wherein the multiple light-emitting pixels on the top surface of the first substrate are active matrix organic light emitting diode pixels, wherein one or more second through-interposer vias of the plurality have electrical outputs on the top surface that are connectively coupled to one or more second voltage terminals for the multiple light-emitting pixels, and wherein the one or more second voltage terminals are cathode terminals if the first voltage terminals are anode terminals and are anode terminals if the first voltage terminals are cathode terminals; and
wherein the control logic layer includes one or more control logic circuits that are connectively coupled to the electrical inputs of the through-interposer vias on the bottom surface, and wherein in operation the control logic circuits control display of light from the multiple pixels by, for each of the multiple pixels, applying electrical current to the at least one first through-interposer via associated with the pixel; and
a housing that is designed to attach to a head of a wearer and that incorporates each of the one or more display panels at a position in front of an eye of the wearer.

16. The head mounted display of claim 15 wherein the one or more display panels include two display panels that each provide illumination to a distinct eye of the wearer, and wherein the head mounted display further comprises an interface that, in operation and for each of the two display panels, receives information about images for the display panel from a virtual reality system and displays the images to the wearer on the display panel.

17. The head mounted display of claim 15 wherein the first and second substrates are separate integrated circuit chips.

18. The head mounted display of claim 15 wherein at least one of the first or second substrates is a gallium arsenide or gallium nitride chip.

19. A method of manufacturing a display panel comprising:
providing a first silicon substrate having a top surface and a bottom surface;
forming, on the top surface of the first silicon substrate, multiple active matrix organic light emitting diode (AMOLED) pixels;
forming a plurality of through-silicon vias between the top and bottom surfaces of the first silicon substrate, wherein the forming includes, for each of at least some of the through-silicon vias:
creating an electrical input for the through-silicon via on the bottom surface and an electrical output for the through-silicon via on the top surface that are connectively coupled; and
coupling the electrical output of the through-silicon via to an anode terminal for one of the multiple pixels;
providing a second silicon substrate;
forming, on the second silicon substrate, one or more control logic circuits; and
joining the first and second silicon substrates together in a stacked structure, wherein the one or more control logic circuits on the second silicon substrate are connectively coupled to the electrical inputs of the at least some through-silicon vias on the bottom surface of the first silicon substrate, and wherein the control logic circuits in operation control display of light from the multiple pixels by selectively applying electrical current to the at least one some through-silicon vias.

* * * * *